United States Patent
Noh

(10) Patent No.: US 9,276,235 B2
(45) Date of Patent: Mar. 1, 2016

(54) ORGANIC LIGHT EMITTING DISPLAY APPARATUS AND METHOD OF MANUFACTURING THE SAME

(71) Applicant: SAMSUNG DISPLAY CO., LTD., Yongin, Gyeonggi-Do (KR)

(72) Inventor: Sung-Ho Noh, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/273,516

(22) Filed: May 8, 2014

(65) Prior Publication Data

US 2015/0084010 A1 Mar. 26, 2015

(30) Foreign Application Priority Data

Sep. 25, 2013 (KR) .................. 10-2013-0114132

(51) Int. Cl.
*H01L 51/52* (2006.01)
(52) U.S. Cl.
CPC ........ *H01L 51/5253* (2013.01); *H01L 51/5259* (2013.01)
(58) Field of Classification Search
None
See application file for complete search history.

(56) References Cited

U.S. PATENT DOCUMENTS

| 2010/0089636 | A1 | 4/2010 | Ramadas et al. |
| 2010/0272945 | A1 | 10/2010 | Nam et al. |
| 2010/0294024 | A1 | 11/2010 | Kumar et al. |
| 2011/0070662 | A1* | 3/2011 | Porter et al. .................. 436/501 |
| 2011/0291116 | A1* | 12/2011 | Kang et al. ...................... 257/88 |
| 2012/0133275 | A1 | 5/2012 | Lee et al. |
| 2012/0168781 | A1* | 7/2012 | Chun et al. ...................... 257/88 |
| 2012/0256218 | A1* | 10/2012 | Kwack et al. ................... 257/98 |
| 2014/0252342 | A1* | 9/2014 | Ramadas et al. ............... 257/40 |

FOREIGN PATENT DOCUMENTS

| KR | 10-0832847 B1 | 5/2008 |
| KR | 10-2010-0014342 A | 2/2010 |
| KR | 10-2010-0026081 A | 3/2010 |
| KR | 10-1130199 B1 | 4/2012 |
| KR | 10-1255537 B1 | 4/2013 |

OTHER PUBLICATIONS

Song et al (Optical absorption behaviour of platinum core-silica shell nanoparticle layer and its influence on the reflection spectra of a multi-layer coating system in the visible spectrum range, Published Apr. 23, 2004).*

* cited by examiner

*Primary Examiner* — Khaja Ahmad
(74) *Attorney, Agent, or Firm* — Lewis Roca Rothgerber Christie LLP

(57) ABSTRACT

An organic light-emitting display apparatus includes a substrate, an organic light-emitting device on the substrate, and a thin film encapsulation layer including a first inorganic film, a first organic film, and fine particles including silica with platinum particles. The fine particles are dispersed on the first organic film, and the thin film encapsulation layer is on the organic light-emitting device.

16 Claims, 4 Drawing Sheets

ORGANIC LIGHT EMITTING DISPLAY APPARATUS AND METHOD OF MANUFACTURING THE SAME

CROSS-REFERENCE TO RELATED APPLICATION

This application claims priority to and the benefit of Korean Patent Application No. 10-2013-0114132, filed on Sep. 25, 2013 in the Korean Intellectual Property Office, the disclosure of which is incorporated herein in its entirety by reference.

BACKGROUND

1. Field

Aspects of one or more embodiments of the present invention are directed toward an organic light-emitting display apparatus and a method of manufacturing the same.

2. Description of the Related Art

An organic light-emitting display apparatus, in comparison to other display apparatuses, has a wide viewing angle, good contrast, and fast response speed such that the organic light-emitting display apparatus has drawn a lot of attention as a next generation display apparatus. The organic light-emitting display apparatus may be used as a display unit of a small-sized product such as a mobile phone or as a display unit of a large-sized product such as a television.

The organic light-emitting display apparatus includes organic light-emitting devices on a substrate, and a thin film encapsulation layer is formed to cover the organic light-emitting devices. Because the organic light-emitting devices are vulnerable to moisture and oxygen, a thin film encapsulation layer is formed on the organic light-emitting devices to prevent the moisture and oxygen from penetrating into a panel from outside and to protect the organic light-emitting devices from the moisture and oxygen that may penetrate from the outside.

The thin film encapsulation layer may be formed on the light-emitting devices by stacking organic and inorganic films.

SUMMARY

A comparative organic light-emitting display apparatus and a manufacturing method thereof have drawbacks including: an increase in the complexity of a deposition process due to a multi-layer structure in which organic and inorganic films are alternatively stacked; an increased process time due to the increased complexity of the deposition process; and a decreased lifespan of the organic light-emitting display apparatus because penetration of moisture and oxygen into a display unit is not completely prevented resulting in the display unit being damaged.

Accordingly, aspects of embodiments of the present invention are directed toward an organic light-emitting display apparatus that may easily prevent moisture and oxygen from penetrating into an inside of a panel from an outside thereof, and a method of manufacturing the organic light-emitting display apparatus.

Aspects of one or more embodiments of the present invention are directed toward an organic light-emitting display apparatus that may easily prevent moisture and oxygen from penetrating into an inside of a panel and a method of manufacturing the organic light-emitting display apparatus. However, the one or more embodiments are not limited thereto.

According to an embodiment of the present invention, an organic light-emitting display apparatus includes: a substrate; an organic light-emitting device on the substrate; and a thin film encapsulation layer including a first inorganic film, a first organic film, and fine particles including silica with platinum particles, the fine particles being dispersed on the first organic film, wherein the thin film encapsulation layer is on the organic light-emitting device.

The thin film encapsulation layer may further include a second organic film arranged on the first organic film.

The fine particles may be between the first and second organic films.

The first and second organic films may be formed as a single layer.

The thin film encapsulation layer may further include a second inorganic film on the second organic film.

A size (e.g., a diameter) of each of the fine particles may be in a range of about 5 nm to about 20 nm.

The silica may include porous silica.

A size (e.g., diameter) of each of the platinum particles may be in a range of about 1 nm to about 10 nm.

A method of manufacturing an organic light-emitting display apparatus includes: preparing a substrate; forming an organic light-emitting device on the substrate; and forming a thin film encapsulation layer on the organic light-emitting device, wherein the forming of the thin film encapsulation layer includes: forming a first inorganic film on the organic light-emitting device; forming a first organic film on the first inorganic film; and dispersing fine particles on the first organic film, the fine particles include silica with platinum particles.

The forming of the thin film encapsulation layer may further include forming of a second organic film on the first organic film.

The dispersing of the fine particles may be performed between the forming of the first organic film and the forming of the second organic film.

The forming of the second organic film may include forming the second organic film on the first organic film to have no interface therebetween.

The forming of the thin film encapsulation layer may further include forming a second inorganic film on the second organic film.

A size (e.g., a diameter) of each of the fine particles may be in a range of about 50 nm to about 200 nm.

The silica may include porous silica.

A size (e.g., a diameter) of each of the platinum particles may be in a range of about 5 nm to about 10 nm.

The first and second organic films may include the same material.

The platinum particles are on a surface and in pores of the silica.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1:
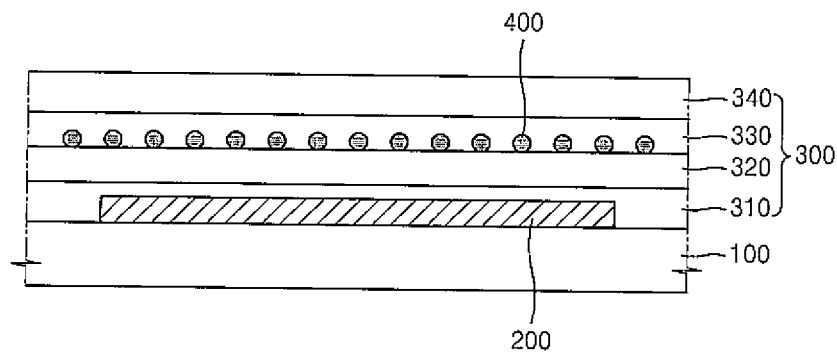
FIG. 1 is a schematic cross-sectional view of an organic light-emitting display apparatus according to an embodiment of the present invention.

Reference will now be made in detail to embodiments, examples of which are illustrated in the accompanying drawings, wherein like reference numerals refer to like elements throughout. However, the present embodiments may have different forms and should not be construed as being limited to the descriptions set forth herein. Accordingly, the embodiments are merely described below, by referring to the figures, to explain aspects of the present invention.

In embodiments hereinafter, x, y, and z axes are not limited to three axes in rectangular coordinates, but they may be explained in a broad sense. For example, x, y, and z axes may be perpendicular to each other but may indicate other directions that are not perpendicular.

It will be understood that when an element or layer is referred to as being "on" another element or layer, the element or layer may be directly on another element or layer, or intervening elements or layers may be present. However, when an element is referred to as being "directly on" another element or layer, there are no intervening elements or layers present. Further, the use of "may" when describing embodiments of the present invention refers to "one or more embodiments of the present invention."

Figure 2:
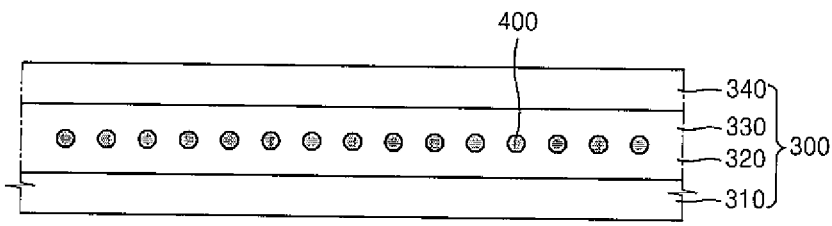
FIG. 2 is a schematic cross-sectional view illustrating a thin film encapsulation layer of an organic light-emitting display apparatus according to another embodiment of the present invention.

FIG. 1 is a schematic cross-sectional view of an organic light-emitting display apparatus according to an embodiment of the present invention, and FIG. 2 is a schematic cross-sectional view illustrating a thin film encapsulation layer of an organic light-emitting display apparatus according to another embodiment of the present invention.

Referring to FIGS. 1 and 2, the organic light-emitting display apparatus includes a substrate 100, an organic light-emitting device 200 arranged on the substrate 100, and a thin film encapsulation layer 300 arranged on the organic light-emitting device 200. The thin film encapsulation layer 300 may include a first inorganic film 310, a first organic film 320, and fine particles 400 dispersed on the first organic film 320. As illustrated in FIG. 1, the thin film encapsulation layer 300 may further include a second organic film 330 and a second inorganic film 340.

The organic light-emitting device 200 may be arranged on the substrate 100 as shown in FIG. 1. In this case, the substrate 100 may be a bottom substrate. The substrate 100 may be formed of various materials, such as glass, metal, plastic, or the like. The arrangement of the organic light-emitting device 200 on the substrate 100 includes both a direct arrangement of the organic light-emitting device 200 on (e.g., directly on) the substrate 100 and an arrangement of the organic light-emitting device 200 on layers formed on the substrate 100 (e.g., on layers stacked adjacent to one another). For example, a thin film transistor (TFT) may be arranged on the substrate 100, an overcoat film may cover the TFT, and then the organic light-emitting device 200 may be disposed on the overcoat film.

FIG. 1 illustrates an embodiment in which the organic light-emitting device 200 is directly disposed on the substrate 100 for convenience.

The organic light-emitting device 200 includes a pixel electrode, an intermediate layer including a light-emitting layer placed on the pixel electrode, and an opposite electrode disposed to cover the intermediate layer and to face the pixel electrode. The structure of the organic light-emitting device 200 will be further described later.

As illustrated in FIG. 1, the thin film encapsulation layer 300 may be arranged on the organic light-emitting device 200 in order to cover (e.g., encapsulate) it. The thin film encapsulation layer 300 may be arranged in an order (e.g., an order along a direction from closest to the substrate 100 to furthest away) of the first inorganic film 310, the first organic film 320, the second organic film 220, and the second inorganic film 340.

For example, the first inorganic film 310 is arranged on the organic light-emitting device 200, and the first organic film 320 is arranged on the first inorganic film 310. In this case, the fine particles 400 may be arranged (e.g., sporadically arranged or dispersed) on the first organic film 320 (e.g., on a surface of the first organic film 320). The second organic film 330 is arranged on the first organic film 320, and the second inorganic film 340 is arranged on the second organic film 330.

The thin film encapsulation layer 300 of the organic light-emitting display apparatus may have a multi-layer structure in which more than one organic and inorganic films are stacked. When the thin film encapsulation layer 300 is formed of only organic films or inorganic films, moisture or oxygen may come from or may penetrate from the outside thereof through a fine passage formed in the films. Therefore, a multi-layer thin film encapsulation layer using an organic/inorganic composite film in which organic and inorganic films are stacked (e.g., alternatively stacked) should be prepared or formed so as to prevent the penetration of the moisture and oxygen therethrough.

The first inorganic film 310 and the second inorganic film 340 may be formed of at least one material selected from the group consisting of silicon nitride, aluminum nitride, zirconium nitride, titanium nitride, hafnium nitride, tantalum nitride, silicon oxide, aluminum oxide, zirconium oxide, magnesium oxide, titanium oxide, cerium oxide, and silicon oxynitride (e.g., SiON), and may be formed as single or multi-layer films.

As described above, the first organic film 320 is arranged or dispersed on the first inorganic film 310. The first organic film 320 may be formed as single or multilayer films and may be formed of at least one material selected from the group consisting of a diazo-based resin, an azide-based resin, an acryl-based resin, a polyamide-based resin, a polyester-based resin, an epoxide-based resin, a polyether-based resin, and a urethane-based resin that are polymerized by, for example, photo polymerization.

As illustrated in FIG. 1, the fine particles 400 are arranged on the first organic film 320. The fine particles 400 may include silica 410 and platinum particles 420 (refer to FIG. 4). For example, the silica 410 may be porous, and the platinum particles 420 may be dispersed as a catalyst on a surface or in pores of the porous silica 410. The fine particles 400 may be dispersed on the first organic film 320. The platinum particles 420 dispersed on the surface and in the pores of the silica 410 of the fine particles 400 prevent the moisture and oxygen from penetrating from the outside therethrough and protect the organic light-emitting device 200 from the moisture and oxygen, which will be further described in more detail later.

Referring to FIG. 1, the fine particles 400 are dispersed on the first organic film 320, and the second organic film 330 may be arranged on the first organic film 320 on which the fine particles 400 are dispersed. The second organic film 330 may be an overcoat film that ensures an upper surface of the first organic film 320 is substantially flat. For example, the fine particles 400 are dispersed on the first organic film 320, and when the second inorganic film 340 is directly arranged on the first organic film 320, the upper surface thereof may not be flat due to the fine particles 400 dispersed on the first organic film 320. As a result, the second organic film 330 may be further arranged on the first organic film 320 in order to ensure that the first organic film 320 is substantially flat. The second organic film 330 illustrated in FIG. 1 is a single layer film but is not limited thereto.

The second organic film 330 may be formed as single or multilayer films and may be formed of at least one material selected from the group consisting of a diazo-based resin, an azide-based resin, an acryl-based resin, a polyamide-based resin, a polyester-based resin, an epoxide-based resin, a polyether-based resin, and a urethane-based resin that are polymerized by, for example, the photo polymerization.

Referring to FIG. 1, the fine particles 400 are dispersed on the first organic film 320, and the second organic film 330 is arranged on the first organic film 320. Therefore, the first and second organic films 320 and 330 may be recognized as being separated (e.g., may be separate or individual layers); however, in the organic light-emitting display apparatus according to another embodiment of the present invention, the first and second organic films 320 and 330 may be one layer (e.g., a single or continuous layer) as illustrated in FIG. 2. When the first and second organic films 320 and 330 are formed of an identical material and the second organic film 330 is arranged on the first organic film 320, the first and second organic films 320 and 330 may be one layer (e.g., a single or continuous layer). The fine particles 400 are dispersed on the first organic film 320, but a size (e.g., a diameter) of each of the fine particles 400 is about 100 nm so that a visible or recognizable interface between the first and second organic films 320 and 330 may not exist. As illustrated in FIG. 2, because the fine particles 400 that are arranged on the first organic film 320 are interposed between the first and second organic films 320 and 330, and because the first and second organic films 320 and 330 do not have a visible interface therebetween, the fine particles 400 may float in the middle of or between (e.g., may be dispersed in or between) the first and second organic films 320 and 330 when a cross-sectional view is observed.

The second inorganic film 340 may be further arranged on the second organic film 330. Based on the upper surface of the substrate 100, that is, along a direction from the substrate 100 toward the organic light-emitting device 200, the uppermost layer of the thin film encapsulation layer 300 may be an inorganic film thereof. However, because an organic film is vulnerable to foreign substances entering from the outside (e.g., penetrating from the outside therethrough), an inorganic film may be arranged as the uppermost layer (e.g., arranged on the uppermost surface) of the thin film encapsulation layer 300 to block the foreign substances from penetrating therethrough. In the organic light-emitting display apparatus, the second inorganic film 340 may be arranged as the uppermost layer of the thin film encapsulation layer 300. However, a third organic film or a third inorganic film may also be stacked or arranged on the second inorganic film 340. In this case, the third organic or inorganic film may be arranged as the uppermost layer (e.g., arranged on the uppermost surface) of the thin film encapsulation layer 300.

Figure 3:
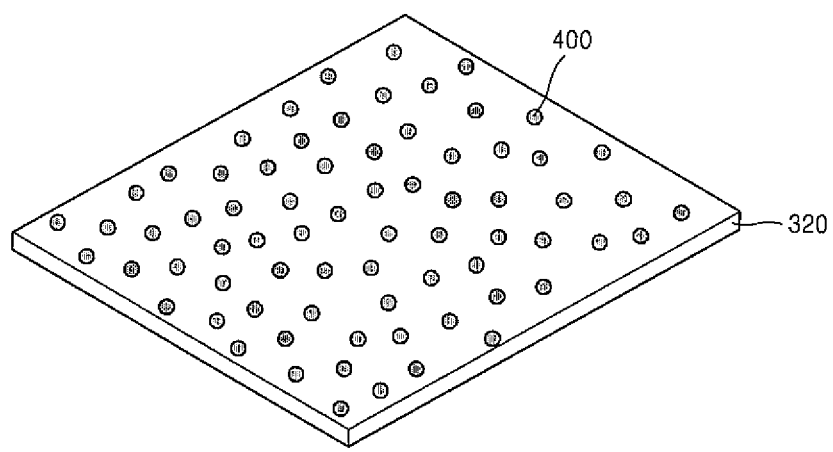
FIG. 3 is a schematic perspective view of a first organic film including the thin film encapsulation layer of the organic light-emitting display apparatus.
Figure 4:
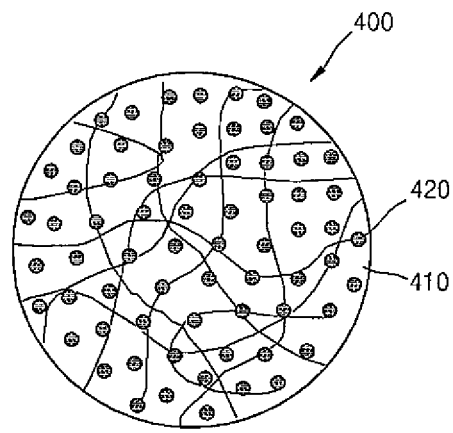
FIG. 4 is a schematic view of one of the fine particles dispersed on the first organic film illustrated in FIG. 3.
Figure 5:
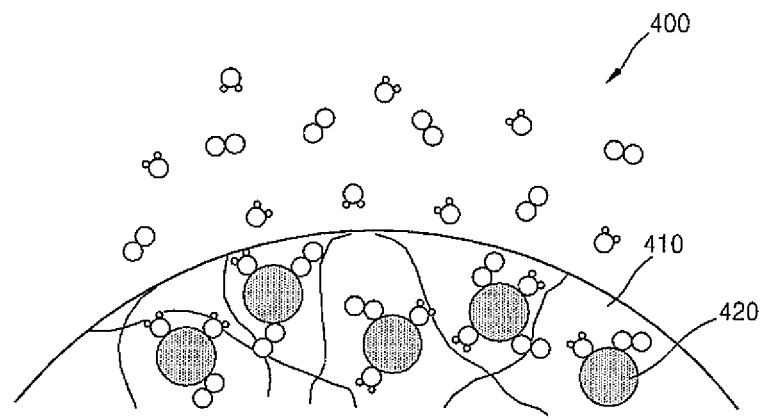
FIG. 5 is an enlarged schematic view of the one of the fine particles illustrated in FIG. 4.

FIG. 3 is a schematic perspective view of the first organic film 320 of the thin film encapsulation layer 300 of the organic light-emitting display apparatus, FIG. 4 is a schematic view of one of the fine particles 400 dispersed on the first organic film 320 illustrated in FIG. 3, and FIG. 5 is an enlarged schematic view of the one of the fine particles 400 illustrated in FIG. 4. The fine particles 400 will be described in more detail with reference to FIGS. 3 through 5.

As illustrated in FIG. 3, the fine particles 400 are dispersed (e.g., randomly dispersed) on the first organic film 320. A method of dispersing the fine particles 400 on the first organic film 320 may include spreading a solution including the fine particles 400 on an organic film and drying the same or forming an organic film and dispersing the fine particles 400 thereon by utilizing a dispenser or the like. The fine particles 400 dispersed on the first organic film 320 prevent moisture and oxygen from penetrating into an inside of a panel from the outside and protect the organic light-emitting display apparatus.

As illustrated in FIG. 4, the fine particles 400 are formed of the silica 410, and the silica 410 may be porous. When attaching the platinum particles 420, which act as a catalyst, to the silica 410, a surface area of the porous silica 410 may be greater than a surface area of other silica such that a greater number of the platinum particles 420 may be attached thereto. The porous silica 410 has multiple pores, and the particles of the platinum 420 may be attached onto the surface and in the pores of the silica 410. A size (e.g., a diameter) of the porous silica 410 may be in a range of about 100 nm to about 200 nm, and a size (e.g., a diameter) of each platinum particle 420 attached to the porous silica 410 may be in a range of about 5 nm to about 10 nm.

FIG. 5 illustrates an enlarged portion of the one of the fine particles 400 illustrated in FIG. 4. Referring to FIG. 5, the platinum particles 420 are dispersed on the surface and in the pores of the porous silica 410. As described above, the fine particles 400 dispersed on the first organic film 320 prevent moisture and oxygen from penetrating into an inside of the panel. That is, the moisture and oxygen attaches to the platinum particles 420 that are dispersed on the surface and in the pores of the porous silica 410 of the fine particles 400, and thus the moisture and oxygen are blocked from reaching the inside of the organic light-emitting display apparatus. Accordingly, when moisture and oxygen that are not blocked by the upper layers of the thin film encapsulation layer 300 penetrate therethrough, the moisture and oxygen entering inside the panel through the thin film encapsulation layer 300 attach to the platinum particles 420 dispersed on the porous silica 410 of the fine particles 400 that are arranged (e.g., randomly arranged) on the first organic film 320. As a result, foreign materials, such as moisture and oxygen, may be prevented from further penetrating inside the panel of the organic light-emitting display apparatus so that a lifespan of the organic light-emitting display apparatus may be increased and occurrence of dead pixels may be reduced (e.g., minimized).

Also, the fine particles 400 may be dispersed to function as a film, rather than forming a separate inorganic film between the first and second organic films 320 and 330, and thus a complexity of a procedure for manufacturing the thin film encapsulation layer 300 is reduced and also a process time is shortened.

Example embodiments of the organic light-emitting display apparatus have been described so far; however, the present invention is not limited thereto. For example, a method of manufacturing the organic light-emitting display apparatus is also included in the scope of the present invention.

FIGS. 6 through 9 are cross-sectional views schematically illustrating a method of manufacturing an organic light-emitting display apparatus.

Figure 6:
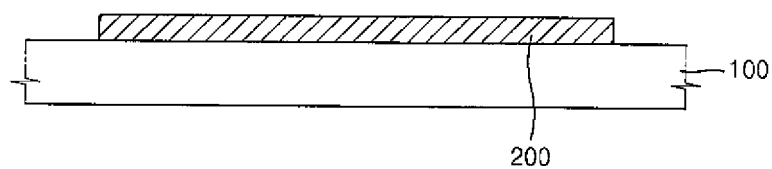
FIGS. 6 through 9 are cross-sectional views schematically illustrating a method of manufacturing an organic light-emitting display apparatus according to an embodiment of the present invention.
Figure 7:
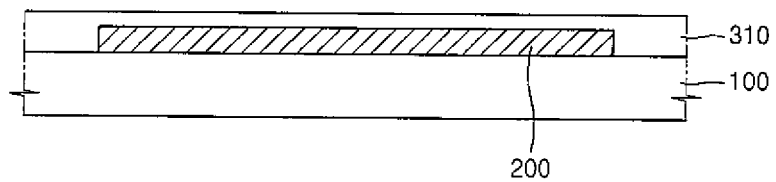

FIG. 6 illustrates preparing the substrate 100 and forming the organic light-emitting device 200 on the substrate 100. In this case, the substrate 100 may be a bottom substrate. The substrate may be formed of various materials such as glass, metal, or plastic. The formation of the organic light-emitting device 200 on the substrate 100 includes not only a direct formation of the organic light-emitting device 200 on the substrate but also a formation of the organic light-emitting device 200 on layers formed on the substrate 100. For example, a TFT may be formed on the substrate 100, covered by an overcoat film, and then the organic light-emitting device 200 may be formed on the overcoat film. In FIGS. 6 through 9 and the description hereinafter, the organic light-emitting device 200 is described as being directly disposed on the substrate 100 for convenience only, but the present invention is not limited thereto.

The organic light-emitting device 200 includes the pixel electrode, the intermediate layer including the light-emitting layer placed on the pixel electrode, and the opposite electrode disposed to cover the intermediate layer and to face the pixel electrode.

As illustrated in FIG. 7 through 10, the thin film encapsulation layer 300 may be formed on the organic light-emitting device 200 in order to cover the same. The thin film encapsulation layer 300 may be arranged in the order (e.g., in the order from closest to the substrate 100 to furthest away) of the first inorganic film 310, the first organic film 320, the second organic film 220, and the second inorganic film 340.

For example, the first inorganic film 310 is formed on the organic light-emitting device 200, and the first organic film 320 is formed on the first inorganic film 310. In this case, the fine particles 400 having the silica 410 to which the platinum particles 420 are included and/or may be arranged (e.g., sporadically arranged) on the first organic film 320. In addition to the formation of the first inorganic film 310 and the first organic film 320, the second organic film 330 may be formed on the first organic film 320, and the second inorganic film 340 may be formed on the second organic film 330.

According to a manufacturing method of the organic light-emitting display apparatus, the thin film encapsulation layer 300 may have a multi-layer structure in which more than one organic film and inorganic film are stacked. When the thin film encapsulation layer 300 is formed only of organic films or inorganic films, moisture or oxygen may enter from the outside through a small passage formed in the films. Therefore, a multi-layer thin film encapsulation layer using an organic/inorganic composite film in which organic and inorganic films are stacked (e.g., alternatively stacked) may be formed so as to prevent the penetration of the moisture and oxygen therethrough.

According to an embodiment of the present invention, the first and second inorganic films 310 and 340 may be formed by a method selected from a group consisting of a sputtering method, a chemical vapor deposition (CVD) method, an electron-beam method, thermal evaporation, and thermal ion beam assisted deposition (IBAD). The first and second inorganic films 310 and 340 may be formed as single or multilayer films and may be formed of at least one material selected from the group of silicon nitride, aluminum nitride, zirconium nitride, titanium nitride, hafnium nitride, tantalum nitride, silicon oxide, aluminum oxide, zirconium oxide, magnesium oxide, titanium oxide, cerium oxide, and silicon oxynitride (e.g., SiON).

Figure 8:
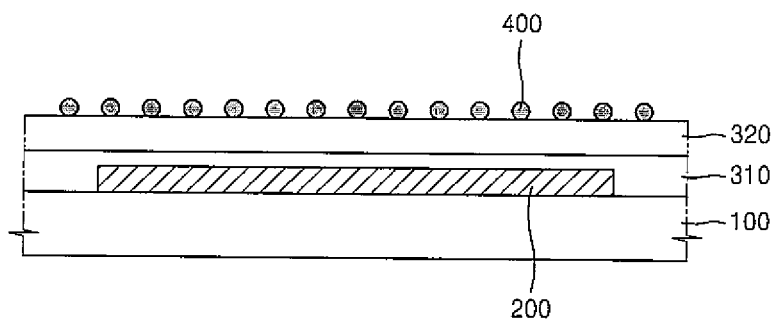

As illustrated in FIG. 8, the fine particles 400 may be arranged or dispersed on the first organic film 320. The first organic film 320 may be formed by, for example, evaporation, CVD, or photo polymerization. The fine particles 400 may include the silica 410 and the platinum particles 420. The fine particles 400 are formed through an operation of preparing silica particles and then an operation of converting the silica particles into the porous silica 410. The silica particles are converted into the porous silica 410 in order to expand or increase a surface area of the silica 410 to ensure that a greater number of the platinum particles 420, which act as a catalyst, may attach thereto. Then, by adding the separate porous silica 410 and the platinum particles 420 into a solution, the porous silica 410 and the platinum particles 420 may be chemically synthesized and then combined with a magnetic bar, the platinum particles 420 may be attached on the surface and in the pores of the porous silica 410.

An operation of arranging the fine particles 400 on the first organic film 320 may be performed between an operation of forming the first organic film 320 and an operation of forming the second organic film 330. Because the fine particles 400 may be randomly arranged on the first organic film 320 and the platinum particles 420 that are dispersed on the surface and in the pores of the porous silica 410 of the fine particles 400 may prevent moisture and oxygen from penetrating therethrough from the outside, the organic light-emitting device 200 may be protected from the external moisture and oxygen.

Figure 9:
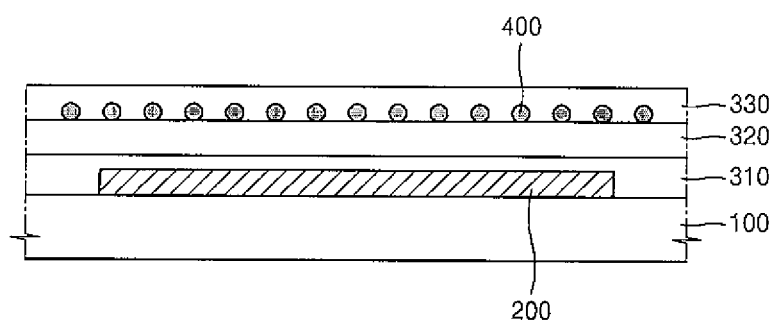

Referring to FIG. 9, the fine particles 400 are dispersed on the first organic film 320, and the second organic film 330 may be formed on the first organic film 320 on which the fine particles 400 are dispersed. The second organic film 330 may be an overcoat film to ensure the upper surface of the first organic film 320 is flat (or planar). In FIG. 9, the second organic film 330 is a single-layer film, but the second organic film 330 may vary, for instance, it may be a multilayer film. The second organic film 330 may be formed by, for example, evaporation, a silk screen process, coating, or polymerization using ultraviolet rays or visible rays.

An operation of forming the second organic film 330 may include forming the second organic film 330 on the first organic film 320 without an interface therebetween. Referring to FIG. 9, the fine particles 400 are dispersed on the first organic film 320, and the second organic film 330 is formed on the first organic film 320. Thus, the first and second organic films 320 and 330 may be recognized as separate or independent layers; however, when the first and second organic films 320 and 330 are formed of an identical material and the second organic film 330 is arranged on the first organic film 320, the first and second organic films 320 and 330 may form one layer (e.g., a single or continuous layer). Although the fine particles 400 are dispersed on the first organic film 320, the size (e.g., the diameter) of each fine particle is about 100 nm so that an interface between the first and second organic films 320 and 330 may be prevented. The first and second organic films 320 and 330 described above may be formed as single or multi-layer films and may be formed of at least one material selected from the group of a diazo-based resin, an azide-based resin, an acryl-based resin, a polyamide-based resin, a polyester-based resin, an epoxide-based resin, a polyether-based resin, and a urethane-based resin that are polymerized by, for example, the photo polymerization.

The thin film encapsulation layer 300 may further include the second inorganic film 340. Based on the upper surface of the substrate 100, that is, along a direction from the substrate 100 toward the organic light-emitting device 200, the uppermost layer of the thin film encapsulation layer 300 may be an inorganic film of the thin film encapsulation layer 300. However, because an organic film is vulnerable to foreign substances entering from the outside (e.g., penetrating therethrough), an inorganic film may be arranged as the uppermost layer (e.g., arranged on the uppermost surface) of the thin film encapsulation layer 300 to block the foreign substances from penetrating therethrough. In the organic light-emitting display apparatus, the second inorganic film 340 may be arranged as the uppermost layer of the thin film encapsulation layer 300, or a third organic film and/or a third inorganic film may be stacked on the second inorganic film 340. In this case, the third inorganic or inorganic film may be arranged as the uppermost layer of the thin film encapsulation layer 300.

As illustrated in FIG. 9, the fine particles 400 are dispersed (e.g., randomly dispersed) on the first organic film 320. The fine particles 400 dispersed on the first organic film 320 may prevent moisture and oxygen from penetrating into an inside of the panel from the outside so as to protect the organic light-emitting display apparatus. The fine particles 400 are formed of the silica 410, and the silica 410 may be porous. The porous silica 410 has multiple pores, and the platinum particles 420 may be attached on the surface and in the pores of the silica 410. A size (e.g., a diameter) of the porous silica 410 may be in the range of about 100 nm to about 200 nm, and a size (e.g., a diameter) of each platinum particle 420 attached to the porous silica 410 may be in the range of about 5 nm to about 10 nm.

When moisture and oxygen that are not blocked by the upper layers of the thin film encapsulation layer 300 penetrate therethrough, the moisture and oxygen entering inside the panel through the thin film encapsulation layer 300 may be attach to the platinum particles 420 dispersed on the porous silica 410 of the fine particles 400 that are arranged (e.g., randomly arranged) on the first organic film 320, and thus further penetration of the moisture and oxygen into the panel of the organic light-emitting display apparatus may be prevented so that the lifespan thereof may increase and the occurrence of dead pixels may be reduced (e.g., minimized).

Also, the fine particles 400 may be dispersed to function as a film, rather than forming a separate inorganic film between the first and second organic films 320 and 330, and thus, a complexity of a manufacturing process of the thin film encapsulation layer 300 is reduced and also a process time is also reduced.

Figure 10:
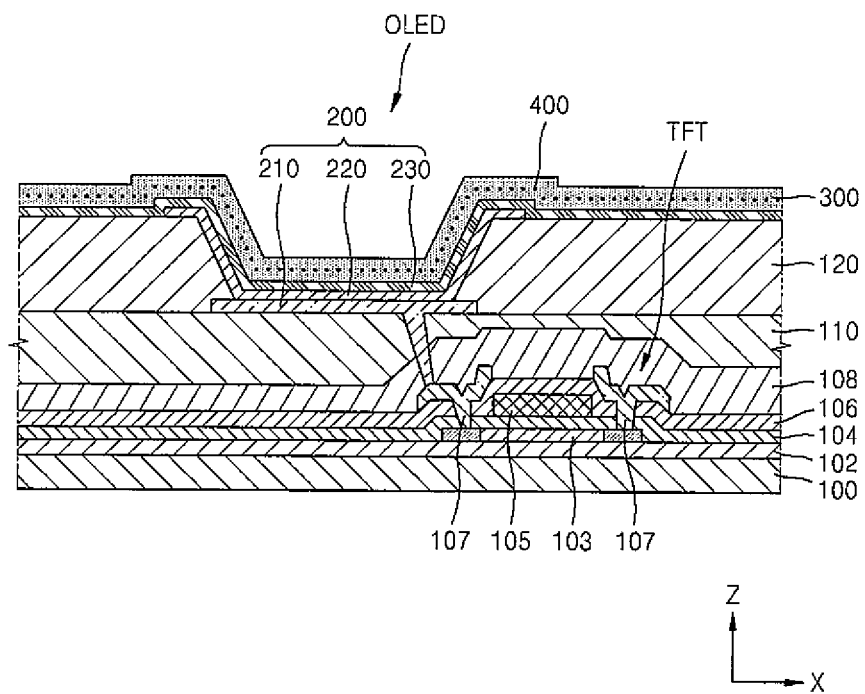
FIG. 10 is a schematic cross-sectional view of an organic light-emitting display apparatus.

FIG. 10 is a schematic cross-sectional view of an organic light-emitting display apparatus.

As illustrated in FIG. 10, the organic light-emitting display apparatus according to an embodiment of the present invention may include a thin film transistor (TFT) arranged on the substrate 100, and the organic light-emitting device 200 that is electrically coupled to (e.g., connected to) the TFT. The TFT includes a semiconductor layer 103 having amorphous silicon, polycrystalline silicon, or an organic semiconductor material, a gate electrode 105, and source and drain electrodes 107.

A buffer layer 102 formed of silicon oxide or silicon nitride is arranged on the substrate 100 in order to ensure a surface of the substrate 100 is flat (e.g., planar) and/or to prevent foreign substances from penetrating into the semiconductor layer 103, and the semiconductor layer 103 may be disposed on the buffer layer 102.

The gate electrode 105 and the source and drain electrodes 107 may include various materials. Adhesion to neighboring layers, surface flatness of layers to be stacked, workability, etc. may be considered when forming the gate electrode 105, and in the case of the source and drain electrodes 107, conductivity or the like may be considered when forming the same. For example, the gate electrode 105 and the source and drain electrodes 107 may be formed to have a single or multilayer structure and may be formed of at least one material selected from the group consisting of aluminum (Al), platinum (Pt), palladium (Pd), silver (Ag), gold (Au), nickel (Ni), neodymium (Nd), iridium (Ir), calcium (Ca), molybdenum (Mo), titanium (Ti), tungsten (W), and copper (Cu).

A gate insulation film 104 may be disposed between the semiconductor layer 103 and the gate electrode 105 so as to prevent conductivity therebetween, and an interlayer insulation film 106 may be disposed between the gate electrode 105 and each of the source and drain electrodes 107. The gate insulation film 104 and the interlayer insulation film 106 may each be formed to have a single or multi-layer structure and may each be formed of a material such as silicon oxide, silicon nitride, or the like.

A protection film 108 covering the TFT may be arranged to protect the same. The protection film 108 may be formed of an inorganic material such as silicon oxide, silicon nitride, silicon oxynitride, or the like. In FIG. 10, the protection film 108 is a single layer, but the protection film 108 is not limited thereto, for instance, the protection film 108 may have a multilayer structure.

An overcoat film 110 may be arranged on the protection film 108. For example, as illustrated in FIG. 10, when the organic light-emitting device 200 is arranged on the upper surface of the TFT, the overcoat film 110 may be arranged to ensure the upper surface of the protection film 108 covering the TFT is substantially flat. The overcoat film 110 may be formed of, for example, an acryl-based organic material, benzocyclobutene (BCB), or the like. In FIG. 10, the overcoat film 110 has a single-layer structure, but the overcoat film 110 is not limited thereto, for instance, the overcoat film 110 may have multi-layer structure.

The organic light-emitting device 200 includes a pixel electrode 210, an opposite electrode 230, and an intermediate layer 220 (that is, disposed between the pixel electrodes 210 and the opposite electrode 230 and includes a light-emitting layer) are arranged on the overcoat film 110.

An opening (e.g., an aperture) for exposing at least one of the source and drain electrodes 107 of the TFT exists in the protection film 110 and in the overcoat film 110, and through the opening, the pixel electrode 210 that is arranged on the overcoat film 110 is electrically coupled to (e.g., electrically connected to) the TFT by contacting the source or drain electrode 107.

A pixel definition film 120 may be arranged on the upper surface of the overcoat film 110. The pixel definition film 120 includes openings (e.g., apertures) corresponding to respective subpixels, and each of the openings (e.g., the apertures) is for exposing a center of the pixel electrode 210 so as to define a pixel. The pixel definition film 120 may be formed of an organic material such as a polyimide.

The pixel electrode 210 may be electrically coupled to (e.g., electrically connected to) the TFT by contacting the source or drain electrode 107 of the TFT. The pixel electrode 210 may be formed of a transparent (or translucent) or reflective electrode. When the pixel electrode 210 is formed of the transparent (or translucent) electrode, the pixel electrode 210 may be formed of indium tin oxide (e.g., ITO), indium zinc oxide (e.g., IZO), zinc oxide (e.g., ZnO), indium oxide (e.g., $In_2O_3$), indium gallium oxide (e.g., IGO), or aluminum zinc oxide (e.g., AZO). When the pixel electrode 210 is formed of the reflective electrode, the pixel electrode 210 may have a reflection film formed of silver (Ag), magnesium (Mg), aluminum (Al), platinum (Pt), palladium (Pd), gold (Au), nickel (Ni), neodymium (Nd), iridium (Ir), chromium (Cr) or compounds thereof, and layers formed of indium tin oxide (e.g., ITO), indium zinc oxide (e.g., IZO), zinc oxide (e.g., ZnO), indium oxide (e.g., $In_2O_3$), indium gallium oxide (e.g., IGO), or aluminum zinc oxide (e.g., AZO). However, one or more embodiments of the present invention are not limited thereto, and thus, the materials and the structures may vary.

The intermediate layer 220 of the organic light-emitting device 200 may include low molecular weight or macromolecular substances. When the intermediate layer 220 includes the low molecular weight substances, a hole injection layer (HIL), a hole transport layer (HTL), an emission layer (EML), an electron transport layer (ETL), an electron injection layer (EIL), etc. may be stacked as single or multi-layer structures. When the intermediate layer 220 includes macromolecular substances, the structure thereof may include the HTL or EML.

However, one or more embodiments of the present invention are not limited thereto.

As illustrated in FIG. 10, the opposite electrode 230 may be arranged to face a front surface of the substrate 100. That is, the opposite electrode 230 may face the pixel electrode 210 and is included in the organic light-emitting devices 200. The opposite electrode 230 may be formed of a transparent (or translucent) or reflective electrode. When the opposite electrode 230 is formed of the transparent (or translucent) electrode, the opposite electrode 230 may include metals having a low work function, for example, layers formed of lithium (Li), calcium (Ca), lithium fluoride/calcium (LiF/Ca), lithium fluoride/aluminum (LiF/Al), aluminum (Al), silver (Ag), magnesium (Mg), or compounds thereof, and the transparent (or translucent) conductive layers may be formed of indium tin oxide (e.g., ITO), indium zinc oxide (e.g., IZO), zinc oxide (e.g., ZnO), or indium oxide (e.g., $In_2O_3$). When the opposite electrode 230 is formed of the reflective electrode, the opposite electrode 230 may have layers formed of lithium (Li), calcium (Ca), lithium fluoride/calcium (LiF/Ca), lithium fluoride/aluminum (LiF/Al), aluminum (Al), silver (Ag), magnesium (Mg), or compounds thereof. The structure and materials of the opposite electrode 230 are not limited thereto, and thus, may vary.

The thin film encapsulation layer 300 may be arranged on the opposite electrode 230. The first inorganic film 310, the first organic film 320, the second organic film 330, and second inorganic film 340 may be arranged on the thin film encapsulation layer 300 in the stated order. In addition, the fine particles 400 are dispersed between the first and second organic films 320 and 330. The platinum particles 420 attached to the porous silica 410 of the fine particles 400 prevent moisture and oxygen from penetrating into the organic light-emitting device 200 so as to protect the same.

While one or more example embodiments of the present invention have been described with reference to the figures, it will be understood by those of ordinary skill in the art that various changes in form and details may be made therein without departing from the spirit and scope of the present invention as defined by the following claims and their equivalents.

What is claimed is:

1. An organic light-emitting display apparatus, the apparatus comprising:
a substrate;
an organic light-emitting device on the substrate; and
a thin film encapsulation layer comprising a first inorganic film, a first organic film, and a second organic film contacting the first organic film, the first inorganic film being between the first organic film and the organic light-emitting device, and fine particles comprising silica with platinum particles, the fine particles being dispersed on an upper surface of the first organic film and between the second organic film.

2. The organic light-emitting display apparatus of claim 1, wherein the second organic film is arranged directly on the first organic film.

3. The organic light-emitting display apparatus of claim 2, wherein the first and second organic films comprise a same material.

4. The organic light-emitting display apparatus of claim 2, wherein the thin film encapsulation layer further comprises a second inorganic film on the second organic film.

5. The organic light-emitting display apparatus of claim 1, wherein a size of each of the fine particles is in a range of about 50 nm to about 200 nm.

6. The organic light-emitting display apparatus of claim 1, wherein the silica comprises porous silica.

7. The organic light-emitting display apparatus of claim 1, wherein a size of each of the platinum particles is in a range of about 1 nm to about 10 nm.

8. A method of manufacturing an organic light-emitting display apparatus, the method comprising:
preparing a substrate;
forming an organic light-emitting device on the substrate; and
forming a thin film encapsulation layer on the organic light-emitting device,
wherein the forming of the thin film encapsulation layer comprises:
forming a first inorganic film on the organic light-emitting device;
forming a first organic film on the first inorganic film;
forming a second organic film directly on the first organic film; and
after the forming the first organic film and before the forming of the second organic film, dispersing fine particles on the first organic film, the fine particles comprising silica with platinum particles.

9. The method of claim 8, wherein the second organic film and the first organic film comprise a same material.

10. The method of claim 8, wherein the forming of the thin film encapsulation layer further comprises forming a second inorganic film on the second organic film.

11. The method of claim 8, wherein a size of each of the fine particles is in a range of about 50 nm to about 200 nm.

12. The method of claim 8, wherein the silica comprises porous silica.

13. The method of claim 8, wherein a size of each of the platinum particles is in a range of about 5 nm to about 10 nm.

14. The organic light-emitting display apparatus of claim 3, wherein the first and second organic films comprise the same material.

15. The organic light-emitting display apparatus of claim 6, wherein the platinum particles are on a surface and in pores of the silica.

16. The method of claim 12, wherein the platinum particles are on a surface and in pores of the silica.

* * * * *